United States Patent
Tsai

(10) Patent No.: US 8,729,581 B2
(45) Date of Patent: May 20, 2014

(54) LIGHT GUIDE FOR LED SOURCE

(75) Inventor: Richard Tsai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 456 days.

(21) Appl. No.: 12/686,569

(22) Filed: Jan. 13, 2010

(65) Prior Publication Data

US 2011/0169026 A1 Jul. 14, 2011

(51) Int. Cl.
*H01L 33/00* (2010.01)

(52) U.S. Cl.
USPC ....... 257/98; 257/E33.067; 385/120; 385/146

(58) Field of Classification Search
None
See application file for complete search history.

(56) References Cited

U.S. PATENT DOCUMENTS

| | | | |
|---|---|---|---|
| 4,076,378 A * | 2/1978 | Cole | 385/115 |
| 5,208,882 A | 5/1993 | Strasser et al. | |
| 5,703,667 A | 12/1997 | Ochia | |
| 6,250,767 B1 | 6/2001 | Kusafuka et al. | |
| 6,573,537 B1 | 6/2003 | Steigerwald et al. | |
| 6,967,437 B1 | 11/2005 | Samuel et al. | |
| 6,969,899 B2 | 11/2005 | Yaung et al. | |
| 7,015,512 B2 | 3/2006 | Park et al. | |
| 7,061,028 B2 | 6/2006 | Yaung et al. | |
| 7,085,056 B2 | 8/2006 | Chen et al. | |
| 7,220,021 B2 | 5/2007 | Wang et al. | |
| 7,326,588 B2 | 2/2008 | Yaung et al. | |
| 7,332,368 B2 | 2/2008 | Yaung et al. | |
| 7,339,197 B2 | 3/2008 | Lin et al. | |
| 7,344,280 B2 | 3/2008 | Panagotacos et al. | |
| 7,511,257 B2 | 3/2009 | Lee et al. | |
| 7,527,416 B2 | 5/2009 | Lin | |
| 7,548,670 B2 | 6/2009 | Ijzerman et al. | |
| 2002/0089420 A1 * | 7/2002 | Martineau et al. | 340/463 |
| 2004/0052077 A1 | 3/2004 | Shih | |
| 2005/0263784 A1 | 12/2005 | Yaw et al. | |
| 2005/0277218 A1 * | 12/2005 | Nakajo et al. | 438/46 |
| 2006/0091411 A1 * | 5/2006 | Ouderkirk et al. | 257/98 |
| 2006/0097271 A1 * | 5/2006 | Eisert et al. | 257/91 |
| 2007/0127240 A1 | 6/2007 | Inamoto | |
| 2007/0258241 A1 * | 11/2007 | Leatherdale et al. | 362/244 |

(Continued)

FOREIGN PATENT DOCUMENTS

| | | | |
|---|---|---|---|
| WO | WO 2008/044759 A1 * | 4/2008 | |
| WO | 2008059098 | 5/2008 | |
| WO | 2008110659 | 9/2008 | |
| WO | 2009091610 | 7/2009 | |

*Primary Examiner* — Fei Fei Yeung Lopez
(74) *Attorney, Agent, or Firm* — Kendall P. Woodruff

(57) ABSTRACT

A device to emit light includes a light emitting diode (LED) die and a light guide coupled to the LED die. The light guide includes a first material having a first index of refraction with a plurality of apertures arranged in a grid. A second material having a second index of refraction that is larger than the first index of refraction fills the plurality of apertures. Each aperture extends from a first end adjacent the LED die to a larger second end. The first end may be a circle of approximately 1 to 2 μm in diameter. The distance between the first and second ends may be from approximately 10 to 20 μm. Each aperture may be in the form of a frustrated cone having an included angle between the sides from approximately 3 to 7 degrees. The light guide may be formed on a transparent substrate.

16 Claims, 2 Drawing Sheets

(56) References Cited

U.S. PATENT DOCUMENTS

| | | | |
|---|---|---|---|
| 2008/0121903 A1* | 5/2008 | Hiramatsu et al. | 257/89 |
| 2008/0185606 A1* | 8/2008 | Sano et al. | 257/98 |
| 2008/0265757 A1 | 10/2008 | Forrest et al. | |
| 2009/0128781 A1 | 5/2009 | Li | |
| 2009/0166518 A1 | 7/2009 | Tak et al. | |
| 2009/0224265 A1 | 9/2009 | Wang et al. | |
| 2009/0237942 A1 | 9/2009 | Lam et al. | |
| 2009/0286346 A1* | 11/2009 | Adkisson et al. | 438/65 |
| 2009/0309116 A1* | 12/2009 | Kato et al. | 257/98 |
| 2010/0038665 A1* | 2/2010 | Sugiura et al. | 257/98 |

* cited by examiner

US 8,729,581 B2

LIGHT GUIDE FOR LED SOURCE

BACKGROUND

1. Field

Embodiments of the invention relate to the field of light emitting diodes (LEDs), and more particularly to LEDs fabricated to reduce the dispersion of emitted light.

2. Background

In light emitting diodes (LEDs), light is produced by a solid state process called electroluminescence. LEDs are becoming increasingly efficient. The efficiency is increasing (lumen/watt) due to improved thermal efficiency and the use of blue LEDs with a high efficiency that are combined with color converting phosphors. Light extraction in LEDs involves the set of particular problems that is connected with getting light from the light emitting p-n junction in a LED to the surroundings, such that the light might be useful, for instance for lighting.

Unfortunately, LEDs emit light not is not directional. The emissive surface of an LED is small, but the light rays are emitted from the emissive part an approximately half sphere, Lambertian radiation pattern. For many applications, a light source is needed with a smaller angular spread. To increase the extraction efficiency and to shape the light output provided by an LED, optics such as lenses and/or reflectors may be used to redirect the light rays emitted by the LED to the needed direction.

Additional optics to shape the LED's light output may be bulky. Further, a significant amount of the light output may be difficult for the additional optics to collect and direct because of the direction in which it is emitted from the LED. It would be desirable to provide a light guide that can be closely coupled to an LED so the LED emits light rays more directionally.

SUMMARY

A device to emit light includes a light emitting diode (LED) die and a light guide coupled to the LED die. The light guide includes a first material having a first index of refraction with a plurality of apertures arranged in a grid. A second material having a second index of refraction that is larger than the first index of refraction fills the plurality of apertures. Each aperture extends from a first end adjacent the LED die to a larger second end. The first end may be a circle of approximately 1 to 2 μm in diameter. The distance between the first and second ends may be from approximately 10 to 20 μm. Each aperture may be in the form of a frustrated cone having an included angle between the sides from approximately 3 to 7 degrees. The light guide may be formed on a transparent substrate.

Other features and advantages of the present invention will be apparent from the accompanying drawings and from the detailed description that follows below.

BRIEF DESCRIPTION OF THE DRAWINGS

The invention may best be understood by referring to the following description and accompanying drawings that are used to illustrate embodiments of the invention by way of example and not limitation. In the drawings, in which like reference numerals indicate similar elements.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
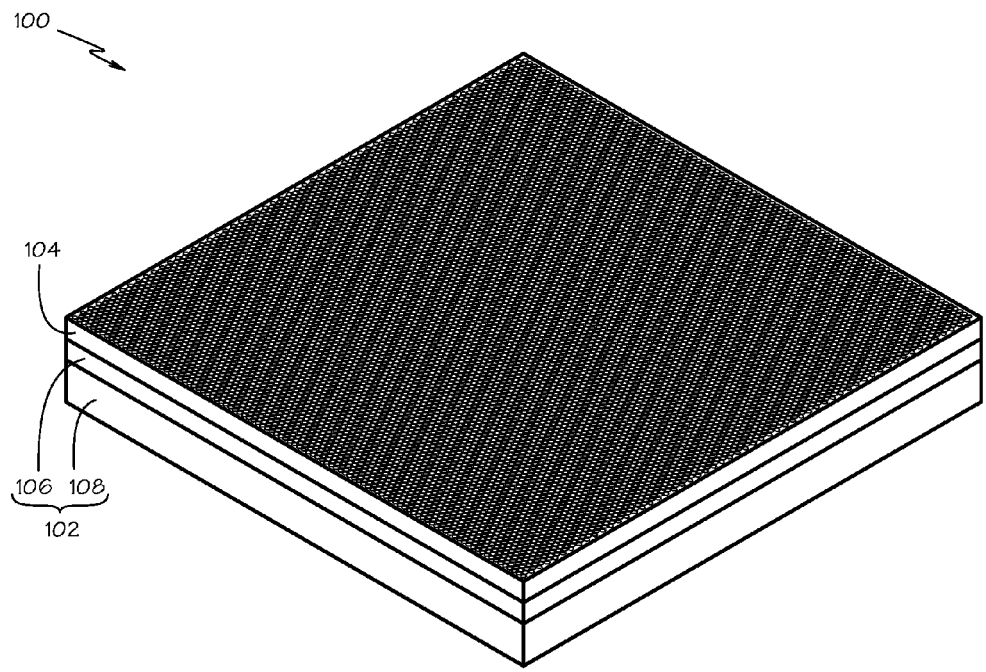
FIG. 1 is a pictorial view of a light guide coupled to an LED die.

FIG. 1 is a pictorial view of a device to emit light 100. A light emitting diode (LED) die 102 emits light into a coupled light guide 104. The LED die 102 may be a p-n junction which is shown as a p-layer 106 deposited on a n-layer 108. It will be appreciated that the LED die may be any of a variety of semiconductor structures the emit light by the process electroluminescence. For the purposes of use with the invention, it is only necessary that light be emitted from the surface of the LED die regardless of its structure. A light guide 104 is coupled to the LED die to direct the emitted light.

Figure 2:
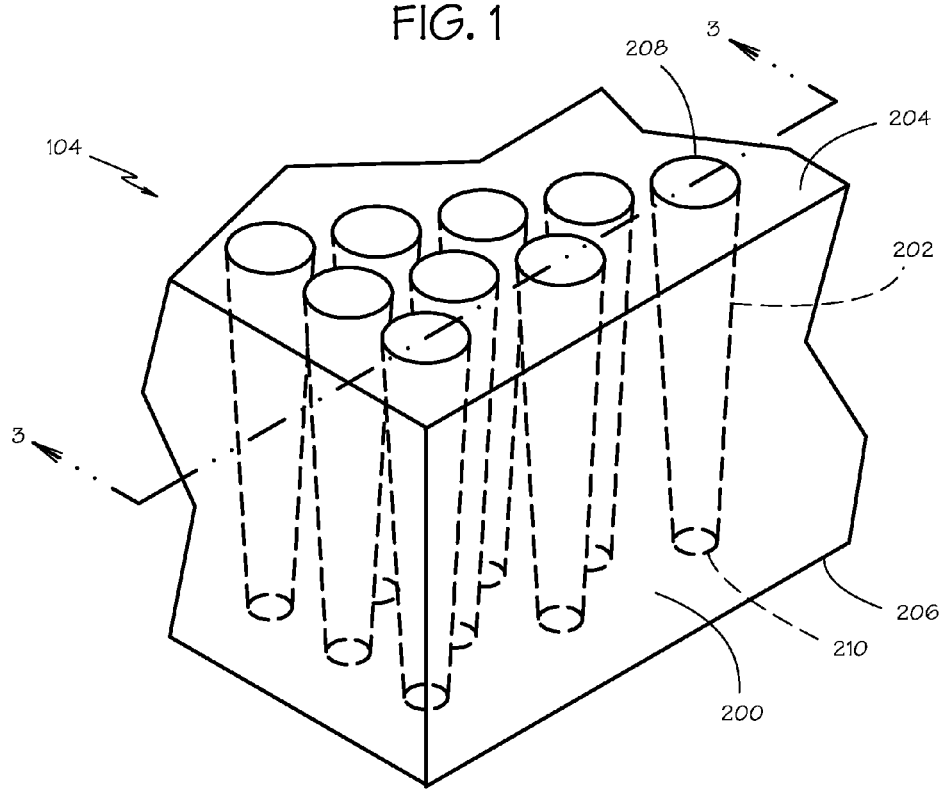
FIG. 2 is a detail of the light guide shown in FIG. 1.

FIG. 2 is a detail of the light guide 104 shown in FIG. 1. A first material 200 having a first index of refraction includes a plurality of apertures 202 arranged in a grid. A second material, having a second index of refraction, fills the plurality of apertures 202. The second index of refraction is larger than the first index of refraction.

The light guide 104 includes a bottom surface 206 that is adjacent the LED die 102 and an opposing top surface 204. Each of the plurality of apertures 202 extends from a first end 210 on the bottom surface 206 to a second end 208 on the top surface 204. The second end 208 is larger than the first end 210. Each of the plurality of apertures in the light guide may be in the form of a frustrated cone as shown in FIG. 2.

A typical LED die may have a dimension of approximately 200 to 300 μm (microns, $10^{-6}$ meters) square, although LED dies of other dimensions may be used with the invention. The distance between the bottom surface 206 and the top surface 204 of the light guide 104 may be from approximately 10 to 20 μm. The first end 210 of each of the apertures 202 may be a circle of approximately 1 to 2 μm in diameter, although other shapes may be used for the cross-section of the apertures. It is important that the first end 210 have a dimension that is somewhat larger than the wavelength of the light emitted by the LED die 102. The second end 208 of each of the apertures 202 may be a circle of approximately 2 to 4 μm in diameter such that the sides of the apertures are at a slight angle from a perpendicular to the bottom surface 206 of the light guide 104.

Figures 3, 4:
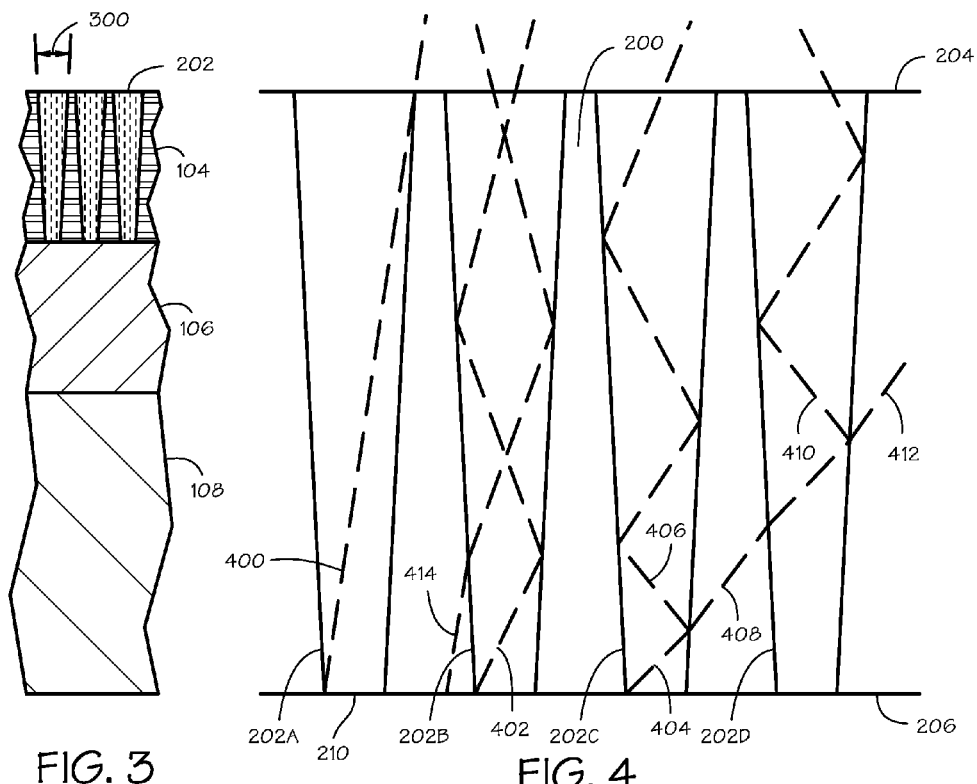
FIG. 3 is a section view of a portion of the light guide and LED die shown in FIG. 1 taken along section line 3-3 of FIG. 2.
FIG. 4 is ray tracing through a portion of the light guide shown in FIG. 1.

FIG. 3 is a section view of a portion of the light guide 104 and LED die 106, 108 taken along section line 3-3 of FIG. 2. The sides of the apertures 202 may have an included angle 300 from approximately 3 to 8 degrees, with the illustrated aperture having an included angle of about 6 degrees. It will be appreciated that the apertures 202 may act as light pipes because of the higher index of refraction for the material that fills the apertures as compared to the index of refraction for the material 200 that forms the outer surface of the apertures.

FIG. 4 is ray tracing through a portion of the light guide. As may be seen in the leftmost aperture 202A, rays of light 400 that are emitted adjacent the first end 210 of the aperture and close to perpendicular with respect to the bottom surface 206 of the light guide will pass through the aperture and emerge from the second end 208 of the aperture.

As may be seen in the aperture 202B second from the left, rays of light 402 that are emitted adjacent the first end 210 of the aperture and at some angle with respect to the bottom surface 206 of the light guide will strike the side of the aperture. Since the first material 204 that forms the sides of the apertures 202 has a lower index of refraction than the second material that fills the apertures, there will be a critical angle for light rays that strike the side of the aperture. The critical angle is measured from a perpendicular to the side surface of the aperture. Light rays that strike the side of the aperture more obliquely than the critical angle will be completely reflected by the side surface of the aperture (total internal reflection).

The first material 204 that forms the sides of the apertures 202 may be a doped silicate glass, such as fluorinated silicate glass, which has a low index of refraction (n value) of perhaps 1.3. The second material that fills the apertures may be a silicon oxides layer, such as a layer deposited on the first material using plasma enhanced chemical vapor deposition (PECVD) and a tetraethylorthosilicate (TEOS) source, which has a higher index of refraction of perhaps 1.45. For the exemplary indices of 1.45 and 1.3, the critical angle will be about 64 degrees from a perpendicular to the side surface of the aperture.

If the sides of the aperture 202 have an included angle of about 6 degrees (each side is about 3 degrees from a perpendicular to the bottom surface 206 of the light guide 104), then light rays 402 that enter the apertures in the light guide at less than about 29 degrees from a perpendicular to the bottom surface will be totally reflected by the sides of the apertures. At each reflection of a light ray at the sides of the apertures, the reflected ray will be closer to the perpendicular by the amount of the included angle of the sides of the aperture 202. Thus if the sides of the aperture 202B have an included angle of about 6 degrees as shown in FIG. 4, and a light ray 402 enters the aperture at about 26 degrees from a perpendicular to the bottom surface as shown, the light ray will emerge at about 14 degrees from the perpendicular after reflecting from the sides twice.

As shown by the two rightmost apertures 202C, 202D in FIG. 4, light rays 404 that enter the apertures in the light guide and strike the sides at less than the critical will be partially reflected 406 into the aperture and partially refracted 408 through the first material between the apertures. The partially refracted ray 408 may enter an adjacent aperture 202D through the side of the aperture. The light ray may strike the side of the aperture and may again be partially reflected 410 and partially refracted 412.

As shown by the two leftmost apertures 202A, 202B in FIG. 4, light rays 414 entering the bottom surface 20 of the light guide 104 between the apertures 202A, 202B may enter the apertures through the sides of the apertures. After being refracted at the side of the aperture where the light ray entered, the light ray may strike the side of the aperture where it may be partially or totally reflected as described above.

The above described reflections and refractions will generally result in directing the light emitted by an LED die 102 so that a greater portion of the light is directed at angles that closer to a perpendicular to the bottom surface 206 of the light guide 104. This will generally be perceived as directing more light forward from the LED die.

It will be appreciated that it may be advantageous to place the apertures 202 close together to maximize the amount of light that enters the light guide 104 through a first end 210 of an aperture 202. It is anticipated that a light guide may be fabricated using processes similar to those used to manufacture semiconductor devices. Depending on the process used to make the light guide 104, it may be possible to have submicron spacing been the larger second ends 208 of the apertures 202 on the top surface 204 of the light guide. The first material may be deposited on a substrate, which may be a surface of the LED die, in one or more layers to achieve the desired thickness. A planarization process may be used to form a flat top surface. The apertures 202 may be formed by etching of the first material. The second material may then be deposited to fill the apertures 202. A further planarization process may be used to form a final flat top surface 204 of the fabricated light guide 104.

Figures 5, 6:
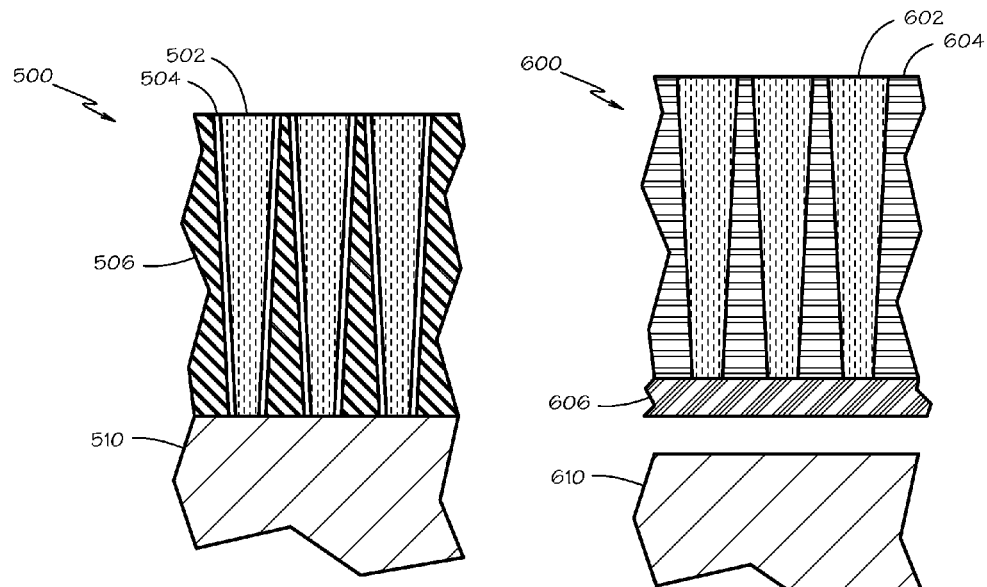
FIG. 5 is a section view of a portion of another light guide and LED die.
FIG. 6 is a section view of a portion of yet another light guide and LED die.

The FIG. 5 is a section view of a portion of another light guide 500 and LED die 510. It may be advantageous to use a third material 506 that does not provide the desired low index of refraction in the initial deposition to fabricate the light guide. In this case, the third material 506 may be etched and the low index first material 504 may be deposited on the third material and etched to form the walls of the apertures. The apertures may then be filled with the high index second material 502. In this way the apertures may be formed with a desired pair of first and second materials to provide the desired relationship of indices of refraction while using a third material chosen for its fabrication properties and without regard to the index of refraction.

FIG. 6 is a section view of a portion of yet another light guide 600 and LED die 610. It may be advantageous to fabricate the light guide 600 on a substrate 606 other than the LED die 610. For example, the upper surface of the LED die 610 may be incompatible with the deposition of the layers of the light guide 600 or the deposition of the layers of the light guide may interfere with the fabrication or operation of the LED die. The light guide 600 may be fabricated on a substrate 606 which may be the same material as either the low index first material 604, the high index second material 602, or a third material having a different index of refraction than either the first or second material. The substrate 606 should be largely transparent or at least translucent to light of the wavelengths emitted by the LED die 610. The light guide 600 may be mechanically coupled to the LED die 610 with the substrate 606 of the light guide adjacent the light emitting surface of the LED die. The substrate 606 may be slighty spaced apart from the light emitting surface of the LED die.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those of ordinary skill in the art. The description is thus to be regarded as illustrative instead of limiting.

What is claimed is:

1. A device to emit light, the device comprising:
   a light emitting diode (LED) die;
   a substrate;
   a light guide deposited on the substrate, the light guide including a first material having a first index of refraction with a plurality of apertures arranged in a grid and a second material having a second index of refraction that fills the plurality of apertures, the second index of refraction being larger than the first index of refraction; and wherein the LED die has a light-emitting surface and wherein the substrate on which the light guide is deposited has a surface that is coupled to the light-emitting surface of the LED die, and wherein the substrate is formed from a material that is the same as one of the first material and the second material.

2. The device of claim 1, wherein the light guide includes a bottom surface that is adjacent the LED die and an opposing top surface, each of the plurality of apertures extending from a first end on the bottom surface to a second end on the top surface, the second end being larger than the first end.

3. The device of claim 2, wherein each of the plurality of apertures in the light guide is in the form of a frustrated cone.

4. The device of claim 3, wherein sides of the frustrated cone have an included angle from approximately 3 to 7 degrees.

5. The device of claim 2, wherein the first end of each of the plurality of apertures in the light guide is a circle having a diameter that is less than 2 μm and larger than a wavelength of light emitted by the LED die.

6. The device of claim 2, wherein a distance between the bottom surface and the top surface of the light guide is from approximately 10 to 20 μm.

7. The device of claim 1, wherein the substrate is a transparent substrate.

8. The device of claim 7, wherein the transparent substrate is between the light guide and the LED die.

9. The device of claim 7, wherein the transparent substrate is spaced apart from the LED die.

10. A light guide to direct light emitted by a light emitting diode (LED) die, the light guide comprising:

a substrate;

a first material deposited on the substrate, the first material having a first index of refraction with a plurality of apertures arranged in a grid, each of the plurality of apertures extending from a first end on a bottom surface of the first material adjacent the substrate to a second end on an opposing top surface of the first material the second end being larger than the first end; and a second material having a second index of refraction that fills the plurality of apertures, the second index of refraction being larger than the first index of refraction, wherein the first material is supported by a third material such that the first material forms a layer between the third material and the second material.

11. The light guide of claim 10, wherein each of the plurality of apertures in the light guide is in the form of a frustrated cone.

12. The light guide of claim 11, wherein sides of the frustrated cone have an included angle from approximately 3 to 7 degrees.

13. The light guide of claim 10, wherein the first end of each of the plurality of apertures in the light guide is a circle having a diameter that is less than 2 μm and larger than a wavelength of light emitted by the LED die.

14. The light guide of claim 10, wherein a distance between the bottom surface and the top surface of the light guide is from approximately 10 to 20 μm.

15. The light guide of claim 10, wherein the substrate is a surface of the LED die.

16. The light guide of claim 10, wherein the substrate is a transparent substrate.

* * * * *